United States Patent [19]
Okai et al.

[11] Patent Number: 4,885,753
[45] Date of Patent: Dec. 5, 1989

[54] SEMICONDUCTOR LASER DEVICE OF VARIABLE WAVELENGTH TYPE

[75] Inventors: Makoto Okai, Koganei; Kazuhisa Uomi, Hachioji, both of Japan; Shinji Tsuji, Red Bank, N.J.; Shinji Sakano, Hachioji; Naoki Chinone, Chofu, both of Japan

[73] Assignee: Hitachi, Ltd., Tokyo, Japan

[21] Appl. No.: 256,318

[22] Filed: Oct. 7, 1988

[30] Foreign Application Priority Data
Oct. 9, 1987 [JP] Japan .................. 62-253617

[51] Int. Cl.$^4$ .................................. H01S 3/19
[52] U.S. Cl. ........................... 372/45; 372/46; 372/50; 372/96
[58] Field of Search ............ 372/43, 45, 46, 96, 372/50

[56] References Cited
U.S. PATENT DOCUMENTS
4,464,762  8/1984  Furuya .................. 372/50

FOREIGN PATENT DOCUMENTS
0213965  3/1987  European Pat. Off. .......... 372/43
0081688  4/1986  Japan ...................... 372/96

OTHER PUBLICATIONS
"Extended Abstract No. 29a-T-7 (The 47th Autumn Meeting, 1986), The Japanese Society of Applied Physics".

Primary Examiner—William L. Sikes
Assistant Examiner—Georgia Y. Epps
Attorney, Agent, or Firm—Kenyon & Kenyon

[57] ABSTRACT

A tunable semiconductor laser device has an active region for generating light, and a feedback region which is optically coupled with the active region and includes a perturbation portion having non-uniform perturbation period. In this semiconductor laser device, the light intensity distribution in the feedback region is changed to vary the degree of coupling of light propagated in the feedback region with a desired part of the perturbation portion, thereby varying the wavelength of emitted light.

22 Claims, 8 Drawing Sheets

SEMICONDUCTOR LASER DEVICE OF VARIABLE WAVELENGTH TYPE

BACKGROUND OF THE INVENTION

The present invention relates to a semiconductor laser device, and more particularly to a tunable semiconductor laser device which can vary the wavelength of generated light in a predetermined range. In other words, the present invention relates to a semiconductor laser device which can be used as a transmitting light source or optical local oscillator in coherent optical communication and high bit-rate optical communication.

A semiconductor laser of the variable wavelength type is described in, for example, Extended Abstract No. 29a-T-7 (The 47-th Autumn Meeting, 1986) the Japan Society of Applied Physics. FIG. 2 shows the structural outline of this semiconductor laser, and is a sectional view taken along the axial direction of a resonant cavity. Referring to FIG. 2, an active region I and a DBR (distributed Bragg reflector) region II are formed on a semiconductor substrate 201. A diffraction grating 211 is formed on that surface area of the substrate 201 which corresponds to the DBR region II, and an optical guide layer 202 and a buffer layer 203 are successively piled all over the surface. Further, semiconductor layers including a cladding layer 205 are piled, and then a current injecting electrode 207 (208) and an opposite electrode 209 are formed. Thereafter, a groove 210 is cut to separate the active region I electrically from the DBR region II. Accordingly, the current injecting electrode is separated into an electrode 208 corresponding to the active region I and an electrode 207 corresponding to the DBR region II. Thus, an exciting current for generating light in an active layer 204 is supplied from the electrode 208 into the active region I, and a current for varying the wavelength of generated light is supplied from the electrode 207 into the DBR region. The current supplied to the electrode 207, that is, carriers injected into the DBR region II vary the refractive index of the optical guide layer 202 included in the DBR region II. This is based upon a phenomenon that the refractive index of the optical guide layer 202 made of a semiconductor material varies in accordance with the carrier density in the layer 202, that is, a plasma effect. Such a change in refractive index of the optical guide layer 202 causes a change in grating constant (namely, perturbation period) of the diffraction grating 211. Thus, when light generated in the active region I is propagated into the DBR region II, the light is affected by the change in perturbation period of the grating 211, and hence the wavelength of fed-back light is varied. Thus, the wavelength of the laser beam emitted from the semiconductor laser can be varied. That is, even when the current supplied to the active region I is kept constant, the wavelength of the laser beam can be varied by changing the current supplied to the DBR regions (that is, the amount of carriers injected into the DBR region).

In tunable semiconductor lasers including the above laser, however, there arises a problem that the wavelength of generated light can be varied only in a narrow range. In more detail, the wavelength of generated light can be varied by several nanometers at most. A tunable semiconductor laser having such a narrow wavelength range is not useful from a practical point of view. Thus, it has been required to develop a tunable semiconductor laser in which the wavelength of generated light can be varied by at least tens of nanometers. However, such a semiconductor laser has not yet been developed. This is because in the prior art, only the carrier density for controlling the refractive index of the optical guide layer 202 included in the DBR region II (that is, the carrier density for controlling the period of optical perturbation in the DBR region II) is used for varying the wavelength of generated light, that is, the wavelength of generated light is varied only by one parameter, and thus it is impossible to enlarge the wavelength range sufficiently.

SUMMARY OF THE INVENTION

In accordance with one aspect of the present invention, there is provided a semiconductor laser device which comprises an active region for generating light, and a feedback region coupled optically with the active region for varying the wavelength of fed-back light by a plurality of structural parameters. The feedback region of the semiconductor laser includes a perturbation portion whose perturbation period is not uniform. Such a perturbation portion is used as one structural parameter for varying the wavelength of the fed-back light. Further, the carrier density injected into the feedback region (that is, the current supplied to the feedback region), the intensity of electric field applied to the feedback region, and others can be used as structural parameters. By combining these structural parameters, it is possible to enlarge the wavelength range of the laser beam emitted from the semiconductor laser in a great degree. In the present invention, the degree of coupling of light propagated in the feedback region with a selected part of the perturbation portion is changed to enlarge the wavelength range of fed-back light. Accordingly, the semiconductor laser device includes means for changing the degree of coupling of the above light with the selected part of the perturbation portion. In other words, a plurality of structural parameters are combined with each other. A plurality of separate electrodes which are formed on the feedback region so as to correspond to a plurality of parts of the perturbation portion, can be used as the above-mentioned means.

In accordance with one aspect of the present invention, there is provided a semiconductor laser device, in which the perturbation portion is divided into a plurality of sub-perturbation portions different in perturbation period from each other. Means for varying the degree of coupling of the light in the feedback region with each sub-perturbation region is provided so as to correspond to the sub-perturbation portion, to vary the wavelength of generated light continuously or discontinuously in a wide range. It is needless to say that the perturbation period may be continuously varied in the perturbation portion. In other words, the perturbation period in the perturbation portion may be distributed in accordance with a desired pattern. According to a aspect of the present invention the degree of coupling of the light in the feedback region with a desired part of the perturbation portion can be changed, and a feedback region is provided with means for changing the above degree of coupling.

In accordance with another aspect of the present invention, there is provided a semiconductor laser device, in which the feedback region is optically coupled with the active region through a phase adjusting region.

The phase adjusting region is specifically effective for a semiconductor laser device with a wide wavelength range according to the present invention. In more detail, the phase of light traveling in the active region can match that of fed-back light in the feedback region, with the aid of the phase adjusting region, and thus the width of a spectral line emitted from the semiconductor laser can be narrowed. The phase adjustment is made by changing the optical path length of phase adjusting means. A change in refractive index of a semiconductor material due to carrier injection or the electrooptic effect can be used for changing the optical path length.

In accordance with another aspect of the present invention, there is provided a semiconductor laser device which comprises a substrate, an active region formed on the substrate, and a feedback region formed on the substrate and coupled optically with the active region, and in which the feedback region includes a perturbation portion having non-uniform perturbation distribution and is provided with means for changing the degree of coupling of light propagated in the feedback region with a part of the perturbation portion. The means for changing the degree of coupling is a means for changing the light intensity distribution in the feedback region. A tunable semiconductor laser having a wide wavelength range can be obtained by providing the above means and the perturbation portion.

In accordance with a another aspect of the present invention, there is provided a semiconductor laser device, in which the feedback region includes an optical guide region, and the optical guide region is formed of one or more optical guide layers. An MQW (multi-quantum well) layer can be used as the optical guide layer. The refractive index of the MQW layer can be changed in a great degree. Accordingly, a semiconductor laser device using the MQW layer as an optical guide layer can vary the wavelength of emitted light efficiently.

One advantage of the present invention is that the wavelength range of the laser beam emitted from a tunable semiconductor laser device can be remarkably enlarged.

Another advantage of the present invention is that the wavelength of the laser beam emitted from a tunable semiconductor laser device can be varied continuously or discontinuously in a wide wavelength range.

A further advantage of the present invention is that a laser beam having a wavelength selected from a wide wavelength range, can be controllably emitted from a tunable semiconductor laser device.

Still a further advantage of the present invention will become apparent to those of ordinary skill in the art upon reading and understanding the following detailed description of the preferred embodiments.

DESCRIPTION OF THE PREFERRED EMBODIMENTS

Figure 1:
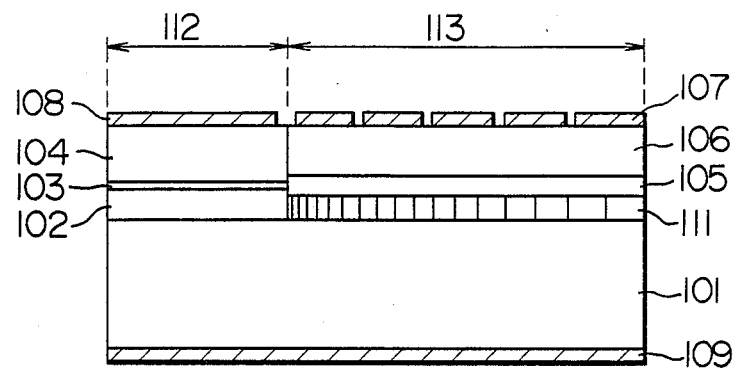
FIG. 1 is a sectional view taken along the axial direction of a resonant cavity and showing the fundamental construction of a semiconductor laser device according to the present invention.
Figure 2:
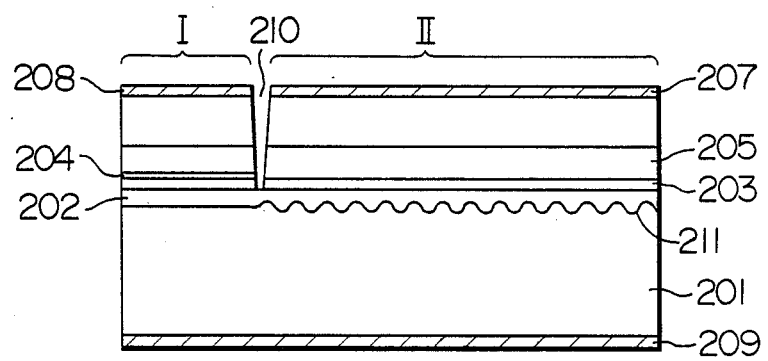
FIG. 2 is a sectional view showing a conventional tunable semiconductor laser.

At first, explanation will be made of the fundamental operation of a semiconductor laser device according to the present invention, with reference to FIG. 1. Referring to FIG. 1, a semiconductor laser device according to the present invention is basically made up of an active region 112 formed on a substrate 101 and a feedback region 113 coupled optically with the active region 112. The active region 112 necessarily includes an active layer 103 which is made of a semiconductor material having a relatively small band gap to generate light. The active layer 103 is sandwiched between semiconductor layers 102 and 104 which are larger in band gap than the active layer 103. A semiconductor layer having a relatively large refractive index may be interposed, as an optical guide layer, between the active layer 103 and one of the semiconductor layers 102 and 104. In this case, an optical confinement region is made up of the active layer 103 and the optical guide layer, and a greater part of light generated in the active layer 103 is distributed in the optical confinement region. The light is generated in the active layer 103 by injecting carriers from an exciting current supply electrode 108 in the active region. A current flowing between the electrode 108 and an electrode 109 which is formed on the substrate 101, contributes to the generation of light in the active layer 103. The direction of this current is dependent upon the conductivity types of semiconductor layers piled on and beneath the active layer 103.

The feedback region 113 is formed so as to be optically coupled with the active region 112. The feedback region 113 includes a perturbation portion 111 and an optical guide region 105. The feedback region 113 is optically coupled with the active region 112 by the optical coupling between the optical guide region 105 and the active layer 103 (or the optical confinement region). It is needless to say that the feedback region 113 may be optically coupled with the active region 112 through an intervening structure such as a phase adjusting region mentioned later, or an air gap. The optical guide region 105 is formed so as to have a relatively large refractive index. The optical guide region 105 may be made up of a plurality of optical guide layers. The perturbation portion 111 is formed in close vicinity to the optical guide region 105. A diffraction grating formed on a semiconductor layer can be used as the perturbation portion 111. One of the features of a a semiconductor laser device according to the present invention resides in that the perturbation portion 111 formed in the feedback region 113 has non-uniform distribution of perturbation period. As one example of the non-uniform distribution of perturbation period, the perturbation portion 111 of FIG. 1 schematically shows a case where the perturbation period is monotonically increased. However, the perturbation portion is not limited to such a case, but may have any non-uniform distribution of perturbation period. For example, the perturbation portion may be made up of a plurality of sub-perturbation portions each having a constant perturbation period. Although in the perturbation portion of FIG. 1, the perturbation period is varied along the axial direction of a resonant cavity, the perturbation period may be varied along a direction other than the axial direction of the resonant cavity, for example, along a direction perpendicular to the axial direction of the resonant cavity. In FIG. 1, the perturbation portion 111 is formed beneath the optical guide region 105. Alternatively, the perturbation portion may be formed above the optical guide region 105, or perturbation portions may be formed above and beneath the optical guide region 105. Further, a semiconductor layer may be sandwiched between the perturbation portion 111 and the optical guide region 105. However, the positional relation between the optical guide region and the perturbation portion is required to satisfy the condition mentioned later.

After a laminated semiconductor structure 106 has been formed on a region including the optical guide region 105 and the perturbation portion 111, a plurality of separate electrodes 107 are formed on the laminated structure 106. The separated electrodes 107 are used as means for varying the light intensity distribution in the feedback region 113, and the means is another feature of a semiconductor laser device according to the present invention. In other words, the separate electrodes are used as means for varying the degree of coupling of light propagated in the feedback region 113 with a part of the perturbation portion 111.

Next, explanation will be given of the operation of the means for varying the light intensity distribution in the feedback region 113. The function of the feedback region of a semiconductor laser according to the present invention will first be explained in detail, with reference to FIGS. 7A and 7B which show a part of the feedback region.

Figure 7A:
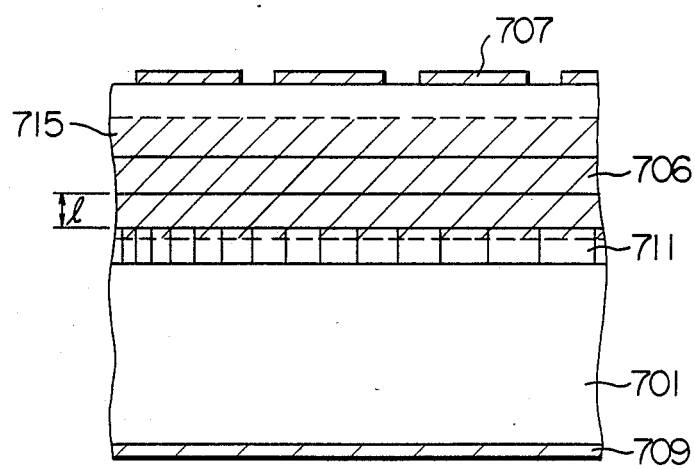
FIGS. 7A and 7B are sectional views which show a part of the feedback region of a semiconductor laser device according to the present invention, to explain a change in coupling of light with the perturbation portion.
Figure 7B:
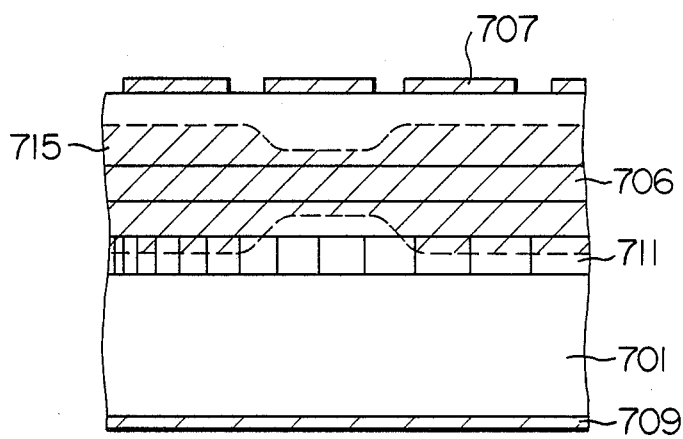

Referring to FIG. 7A, in a case where the feedback region is uniformly applied with an electric field, that is, an electric current is uniformly supplied, light traveling from an active layer into the feedback region is distributed in a hatched region 715 so that an optical guide region 706 has a large light intensity. In more detail, part of the light is propagated into a perturbation portion 711, and thus laser oscillation is generated which has an oscillation frequency determined by the state of coupling of the above light with the perturbation portion 711. When the voltage applied to one of separate electrodes 707 or the current supplied to the electrode is varied to change the refractive index of that part of the optical guide layer 706 which corresponds to the above electrode, the light intensity distribution in the feedback region is varied as shown in FIG. 7B, and thus the degree of coupling of light traveling in the feedback region with that part of the perturbation portion 711 which corresponds to the electrode, is varied. It is to be noted that FIG. 7B shows a case where the degree of coupling is decreased. As mentioned above, the wavelength of fed-back light in the feedback region can be changed by varying the degree of coupling of light traveling in the feedback region with a part of the perturbation portion, and thus the wavelength of a laser beam emitted from the semiconductor laser device can be varied. According to the present invention, the perturbation portion has non-uniform distribution of perturbation period, and hence the wavelength of generated light can be varied in a wide range by changing the light intensity in various parts of the feedback region.

As can be seen from the above, the state of coupling of light traveling in the feedback region with the perturbation portion having the non-uniform distribution of perturbation period, is very important in a semiconductor laser device according to the present invention. Further, in order to generate single-mode oscillation stably, it is desired that the distance between the perturbation portion and the optical guide satisfies a condition, that is, it is desirable to put the distance in a predetermined range. This range is dependent upon the refractive indices of semiconductor layers included in the feedback region. It is desirable to make the distance l or a thickness l of an intermediate region between the optical guide region 706 and the perturbation region 711 as shown in FIG. 7A less than or equal to 0.5 $\mu$m. Preferably, the distance l is made less than or equal to 0.2

μm. The intermediate region corresponds to layer 306 in FIG. 3.

A semiconductor laser device according to the present invention will be explained below in further detail.

Figure 3:
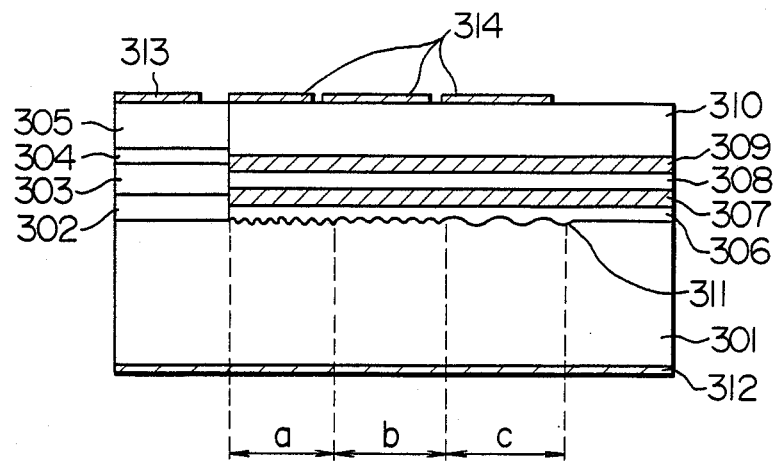
FIG. 3 is a sectional view showing an embodiment of a semiconductor laser device according to the present invention.

Now, explanation will be made of an embodiment of a semiconductor laser device according to the present invention, with reference to FIG. 3. The present embodiment is divided into the active region and the feedback region, and each of these regions has a multilayer structure as mentioned below. Referring to FIG. 3, an n-InGaAsP optical guide layer 302, an InGaAsP active layer 303, a p-InGaAsP anti-meltback layer 304 and a p-InP cladding layer are successively piled or stacked on an n-InP substrate 301 by the epitaxial growth method, to form the active region. In the feedback region, a perturbation portion 311 including a sub-perturbation portion a (that is, a first diffraction grating having a grating constant of 235 nm), a sub-perturbation portion b (that is, a second diffraction grating having a grating constant of 240 nm) and a sub-perturbation portion c (that is, a third diffraction grating having a grating constant of 245 nm) is formed on the n-InP substrate 301, and then an n-InP lower cladding layer 306, an n-InGaAsP lower optical guide layer 307, an n-InGaAsP middle cladding layer 308, an InGaAsP-InP MQW (multi-quantum well) layer 309 and a p-InP upper cladding layer 310 are successively piled or stacked on the perturbation portion 311 by the epitaxial growth method. A negative electrode 312 is formed all over the rear surface of the subtrate 301. Further, an electrode 313 for supplying an exciting current is formed on the cladding layer 305 of the active region, and a plurality of separate, positive electrodes 314 are formed on those surface areas of the upper cladding layer 310 of the feedback region which correspond to the sub-perturbation portions a, b and c. The wavelength of generated light can be continuously varied in a range from 1.545 to 1.549 μm by adjusting a voltage which is applied to the electrode 314 corresponding to the sub-perturbation portion a having a perturbation period of 235 nm. Further, the wavelength of generated light can be continuously varied in a range from 1.548 to 1.552 μm by adjusting a voltage which is applied to the electrode 314 corresponding to the sub-perturbation portion b having a perturbation period of 240 nm. Furthermore, the wavelength of generated light can be continuously varied in a range from 1.551 to 1.555 μm by adjusting a voltage which is applied to the electrode 314 corresponding to the sub-perturbation portion c having a perturbation period of 245 nm. Thus, according to the present embodiment, the wavelength of generated light can be varied in a range from 1.545 to 1.555 μm, that is, a wavelength range having a width of 100 Å. Moreover, a laser beam having a single mode is always emitted in the above wavelength range.

Figure 4:
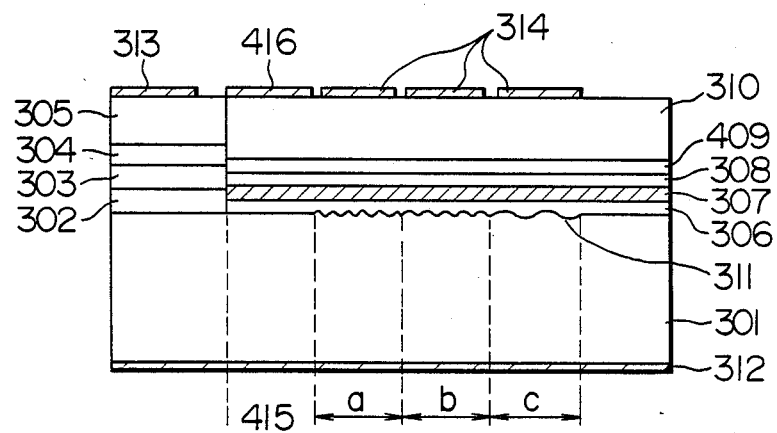
FIG. 4 is a sectional view showing another embodiment of a semiconductor laser device according to the present invention which embodiment has a structure suited to narrow the width of a spectral line emitted therefrom.

Next, explanation will be given of another embodiment of a semiconductor laser device according to the present invention, with reference to FIG. 4. In Figs. 3 and 4, like reference numerals designate like parts. The embodiment of FIG. 4 is different from the embodiment of FIG. 3 in that a p-InGaAsP upper optical guide layer 409 is formed in place of the MQW layer 309, and a phase adjusting region 415 and an electrode 416 for phase adjustment are additionally provided. In the embodiment, of FIG. 4, the wavelength of generated light can be continuously varied in a wavelength range having a width of 100 Å. by adjusting a current which is supplied to one of the electrodes 314 corresponding to the subperturbation portions a, b and c. Further, the width of a spectral line emitted from the present embodiment can be always made less than 5 MHz by adjusting a current supplied to the phase adjusting region 415.

In the embodiments of FIGS. 3 and 4, the wavelength of generated light can be continuously varied as mentioned above. However, when a voltage applied to one of the electrodes 314 corresponding to the subperturbation portions a, b and c is appropriately selected, or the sub-perturbation portions are made greatly different in perturbation period from each other, the wavelength of generated light can be dis-continuously varied in a wider range.

Figure 5A:
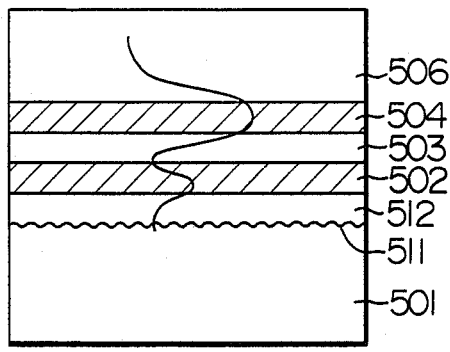
FIGS. 5A and 5B are sectional views which show a part of the feedback region of a semiconductor laser device according to the present invention, to explain a change in light intensity distribution at the feedback region.
Figure 5B:
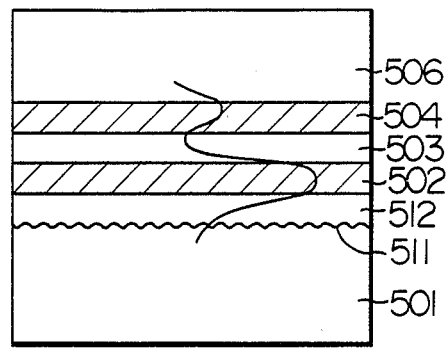

Next, explanation will be made of the operation principle of an inventive semiconductor laser device in which the optical guide region of the feedback region includes a plurality of optical guide layers, with reference to FIGS. 5A and 5B. It is to be noted that the embodiments of FIGS. 3 and 4 are examples of such a semiconductor laser device. FIGS. 5A and 5B show a part of the feedback region of the semiconductor laser device. Referring to FIGS. 5A and 5B, a diffraction grating 511 is formed on a substrate 501, to be used as the perturbation portion. Further, a cladding layer 512, a lower optical guide layer 502, another cladding layer 503, an upper optical guide layer 504 (formed of, for example, a multi-quantum well (MQW) layer), and a further cladding layer 505 are piled on the perturbation portion 511. In a case where no current or voltage is supplied to the feedback region, light generated in the active region is propagated into the feedback region so as to have the light intensity distribution indicated by a curve in FIG. 5A. In this case, the light is scarcely distributed in the perturbation portion, and hence the coupling of the light with the perturbation portion is weak. When a current or voltage is supplied to the multi-layer structure of FIG. 5A, the refractive index of the MQW layer 504 is greatly reduced, and thus the light intensity distribution is changed as shown in FIG. 5B. That is, the peak of the light intensity distribution is moved to the lower optical guide layer 502. As a result, the light is strongly coupled with the perturbation portion. When the MQW layer used as the upper optical guide layer 504 is compared with a single semiconductor layer used as the optical guide layer 504, a change in refractive index of the MQW layer due to the applied voltage is greater than a change in refractive index of the single semiconductor layer due to the applied voltage, by more than one order of magnitude, and hence the MQW layer can exhibit a remarkable effect. The above phenomenon can be utilized for the perturbation portion having a plurality of sub-perturbation portions. That is, when separate electrodes are provided at positions corresponding to the sub-perturbation portions, a desired one of the subperturbation portions can be strongly coupled with light traveling in the feedback region. The upper optical guide layer 504 may be formed of a single semiconductor layer. Further, either or both of the upper and lower optical guide layers 504 and 502 may be formed of an MQW layer.

Next, explanation will be given of a further embodiment of a semiconductor laser device according to the present invention, with reference to FIG. 6.

Figure 6:
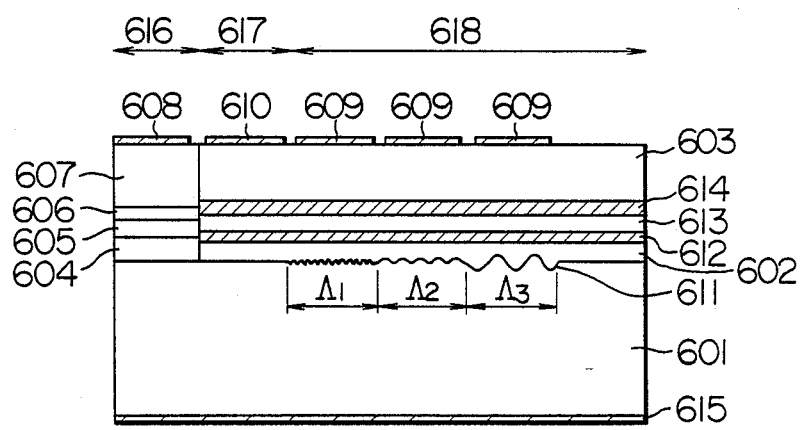
FIG. 6 is a sectional view showing a further embodiment of a semiconductor laser device according to the present invention.

Referring to FIG. 6, the present embodiment is made up of an active region 616, a phase adjusting region 617 and a feedback region 618, and each of these regions has a multi-layer structure as mentioned below.

In the active region 616, an n-InGaAsP optical guide layer 604, an undoped InGaAsP active layer 605, a p-InGaAsP anti-meltback layer 606 and a p-InP cladding layer 607 are successively piled on an n-InP substrate 601 by the epitaxial growth method. In the phase adjusting region 617, an n-InGaAsP lower cladding layer 602, an undoped InGaAsP lower optical guide layer 612, an undoped InGaAsP middle cladding layer 613, an undoped InGaAsPInP MQW layer 614 and a p-InP upper cladding layer 603 are successively piled on the substrate 601 by the epitaxial growth method. In the feedback region 618, a perturbation portion 611 made up of three diffraction gratings (namely, three sub-perturbation portions) is formed on the n-InP substrate 601 by the contact exposure method so that the first one of the diffraction gratings has a grating constant $\Lambda_1$ equal to 237 nm, the second diffraction grating has a grating constant $\Lambda_2$ equal to 238 nm, and the third diffraction grating has a grating constant $\Lambda_3$ equal to 239 nm. Then, the same layers 602, 612, 613, 614 and 603 as in the phase adjusting region 617 are successively formed by the epitaxial growth method. It is needless to say that after the perturbation portion 611 has been formed, the layers 602, 612, 613, 614 and 604 may be successively grown in both of the optical adjusting region 617 and the feedback region 618. Thereafter, a negative electrode 615 and positive electrodes 608, 609 and 610 are formed by the evaporation method. In the present embodiment, the wavelength of generated light can be continuously varied in a range from 1.540 to 1.560 $\mu$m (that is, a wavelength range having a width of 20 nm) by changing a ratio of the voltage applied to one of three electrodes 609 in the feedback region 618 to the voltage applied to the remaining electrodes 609. A ratio of the power of a main mode to the power of a sub-mode is always greater than 35 dB in the above wavelength range, and thus laser oscillation having a single longitudinal mode can be stably generated. Further, the width of a spectral line emitted from the present embodiment can be always made less than 10 MHz by adjusting the voltage applied to the electrode 610 of the phase adjusting region 616.

Figure 8:
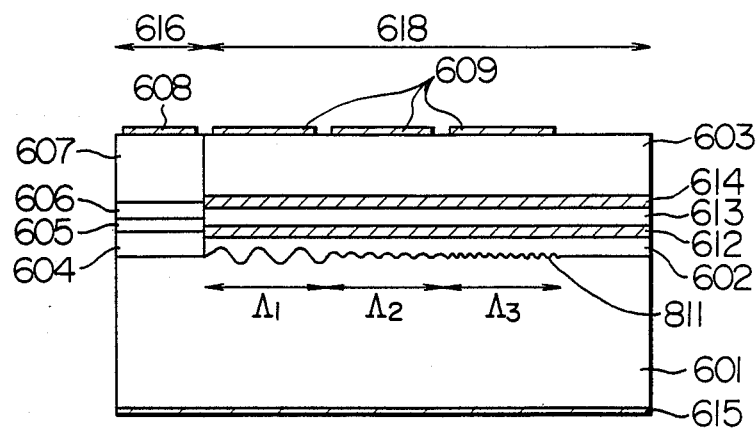
FIG. 8 is a sectional view showing a different embodiment of a semiconductor laser device according to the present invention.

Yet another embodiment of a semiconductor laser device according to the present invention, is illustrated in FIG. 8. This present embodiment is different from the embodiment of FIG. 6 in that a phase adjusting region is not provided between the active region 616 and the feedback region 618. Further, in this embodiment, the first one of three diffraction gratings for making up a perturbation portion 811 has a grating constant $\Lambda_1$ equal to 240 nm, the second diffraction grating has a grating constant $\Lambda_2$ equal to 238 nm, and the third diffraction grating has a grating constant $\Lambda_3$ equal to 236 nm. According to the present embodiment, the wavelength of generated light can be continuously varied in a range from 1.530 to 1.570 $\mu$m (that is, a wavelength range having a width of 40 nm) by changing a ratio of the voltage applied to one of three electrodes 609 in the feedback region 618 to the voltage applied to the remaining electrodes 609.

Figure 9A:
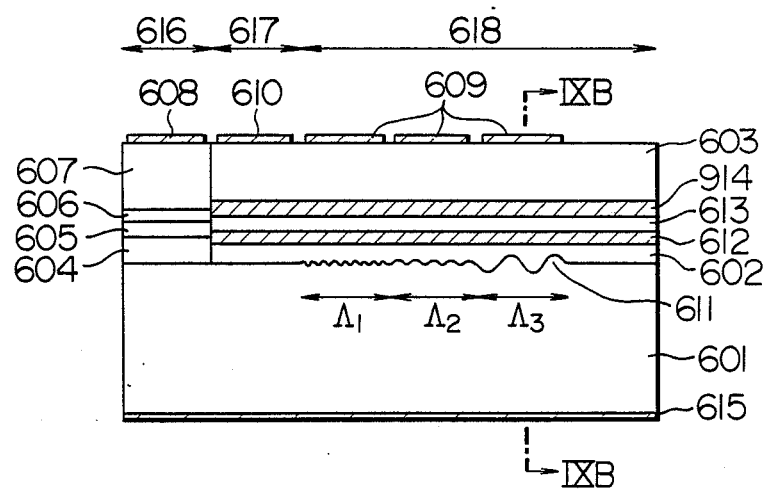
FIG. 9A is a sectional view taken along the axial direction of a resonant cavity and showing still another embodiment of a semiconductor laser device according to the present invention which embodiment has a structure suited to narrow the width of a spectral line emitted therefrom.
Figure 9B:
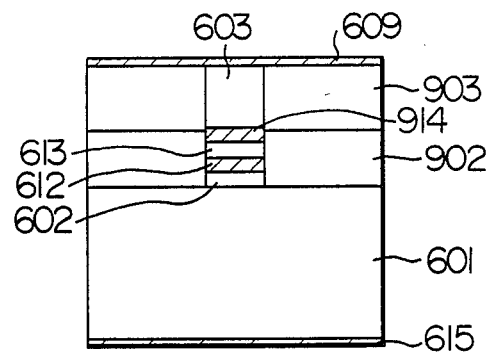
FIG. 9B is a sectional view taken along the line IXB—IXB' of FIG. 9A.

Next, explanation will be made of still another embodiment of a semiconductor laser device according to the present invention, with reference to FIGS. 9A and 9B. FIG. 9A is a sectional view showing the present embodiment and taken along the axial direction of a resonant cavity, and FIG. 9B is a sectional view taken along the line IXB—IXB' of FIG. 9A. The stacked semiconductor layers in the present embodiment are identical with those in the embodiment of FIG. 6, except that the undoped InGaAsP-InP MQW layer 614 is replaced by a p-InGaAsP upper optical guide layer 914. Further, in this embodiment, after the layers 602, 612, 613, 914 and 603 have been grown in the phase adjusting region 617 and the feedback region 618, these layers are selectively etched so that a stripe of the layers having a width of 1 $\mu$m is left unetched. Then, as shown in FIG. 9B, a p-InP layer 902 and an n-InP layer 903 are grown so that the above stripe is buried in the layers 902 and 903. Thereafter, the positive electrodes 608 and 609 and the negative electrode 615 are formed by the evaporation method. According to the above structure, a current supplied to the phase adjusting region 617 and the feedback region 618 can flow through only the upper optical guide layer 914 of two optical guide layers 612 and 914, and hence only the refractive index of the upper optical guide layer 914 can be reduced. Thus, the wavelength of generated light can be continuously varied in a range from 1.540 to 1.560 $\mu$m (that is, a wavelength range having a width of 20 nm) by changing a ratio of the current supplied to one of three electrodes 609 in the feedback region 618 to the current supplied to the remaining electrodes 609.

Next, explanation will be made of still a further embodiment of a semiconductor laser device according to the present invention, with reference to FIG. 10.

Figure 10:
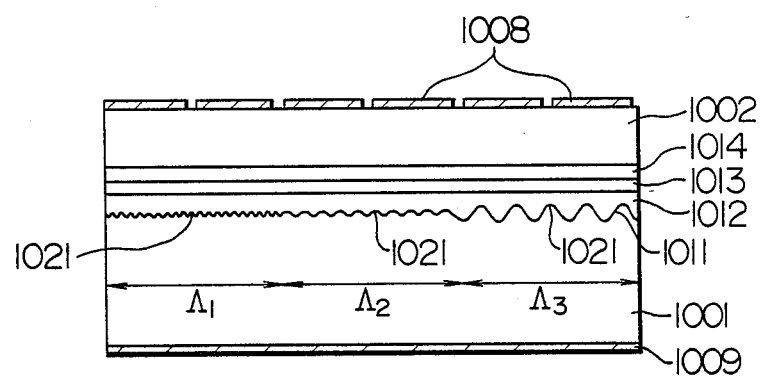
FIG. 10 is a sectional view showing still a further embodiment of a semiconductor laser device according to the present invention, which embodiment is not divided into an active region and a feedback region, but performs the functions of active and feedback regions in the whole region.

Referring to FIG. 10, a perturbation portion 1011 made up of three diffraction gratings (namely, three sub-perturbation portions) is formed on a surface of an n-InP substrate 1001. The first one of the diffraction gratings has a grating constant $\Lambda_1$ equal to 238.0 nm, the second diffraction grating has a grating constant $\Lambda_2$ equal to 238.2 nm, and the third diffraction grating has a grating constant $\Lambda_3$ equal to 238.4 nm. Further, at the center of each diffraction grating, the unevenness for forming a grating is subjected to 180° phase shift, that is, a $\lambda/4$ shift 1021 is provided. Thereafter, an n-InGaAsP optical guide layer 1012, an undoped InGaAsP active layer 1013, a p-InGaAsP anti-meltback layer 1014 and a p-InP layer 1002 are successively formed by the epitaxial growth method. Then, a plurality of positive electrodes 1008 and a negative electrode 1009 are formed by the evaporation method. In the present embodiment, the perturbation portion 1011 includes three diffraction gratings having different grating constants, and hence the wavelength of generated light can be varied in such a manner that one of the diffraction gratings is selectively coupled with light. Further, two positive electrodes 1008 are provided for one diffraction grating. Hence, the wavelength of generated light can be slightly varied by making the current supplied to one of the above electrodes different from the current supplied to the other electrode. Thus, the wavelength of generated light can be continuously varied in a range from 1.540 to 1.546 $\mu$m (that is, a wavelength range having a width of 6 nm) by adjusting currents supplied to six positive electrodes 1008. Further, a ratio of the power of a main mode to the power of a sub-mode is greater than 35 dB, and thus laser oscillation having a single longitudinal mode can be stably generated.

Next, explanation will be made of still a different embodiment of a semiconductor laser device according to the present invention, with reference to FIG. 11.

Figure 11:
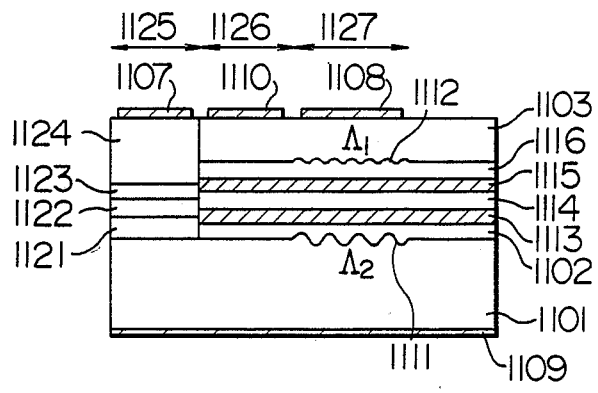
FIG. 11 is a sectional view showing still a different embodiment of a semiconductor laser device according to the present invention, which embodiment has a structure suited to narrow the width of a spectral line emitted therefrom and indicates that the feedback region may include a plurality of perturbation portions and each perturbation portion may be formed only in a limited part of the feedback region.

Referring to FIG. 11, the present embodiment includes an active region 1125, a phase adjusting region 1126 and a feedback region 1127. In the active region 1125, an n-InGaAsP optical guide layer 1121, an undoped InGaAsP active layer 1122, a p-InGaAsP anti-meltback layer 1123 and a p-InP cladding layer 1124 are successively piled on an n-InP substrate 1101 by the epitaxial growth method. In the phase adjusting region 1126 and the feedback region 1127, an n-InGaAsP lower cladding layer 1102, an undoped InGaAsP lower optical guide layer 1113, an undoped InGaAsP middle cladding layer 1114, an undoped InGaAsP-InP MWQ layer 1115, a p-InGaAsP upper cladding layer 1116 and a p-InP cladding layer 1103 are successively formed by the epitaxial growth method. Further, in the feedback region 1127, a diffraction grating having a grating constant $\Lambda_2$ equal to 235.0 nm is formed on a limited surface area of the n-InP substrate 1101, to be used as a sub-perturbation portion 1111, and a diffraction grating having a grating constant $\Lambda_1$ equal to 240.0 nm is formed on a limited surface area of the p-InGaAsP upper cladding layer 1116, to be used as another sub-perturbation portion 1112. After the above-mentioned semiconductor layers have been formed, a negative electrode 1109 and positive electrodes 1107, 1110 and 1108 are formed by the evaporation method. In this present embodiment, the wavelength of generated light can be continuously varied in a range from 1.540 to 1.560 μm (that is, a wavelength range having a width of 20 nm) by adjusting the voltage applied to the electrode 1108 of the feedback region 1127, and moreover laser oscillation having a single longitudinal mode can be stably generated, since a ratio of the power of a main mode to the power of a sub-mode is always greater than 35 dB in the above wavelength range. Further, the width of a spectral line emitted from the present embodiment can be always made less than 10 MHz by adjusting the voltage applied to the electrode 1110 of the phase adjusting region 1126.

Next, explanation will be made of yet still another embodiment of a semiconductor laser device according to the present invention, with reference to FIG. 12. The present embodiment is different from the embodiment of FIG. 6 in that a plurality of separate electrodes (for example, two separate electrodes) are provided for each sub-perturbation portion having a constant perturbation period.

Figure 12:
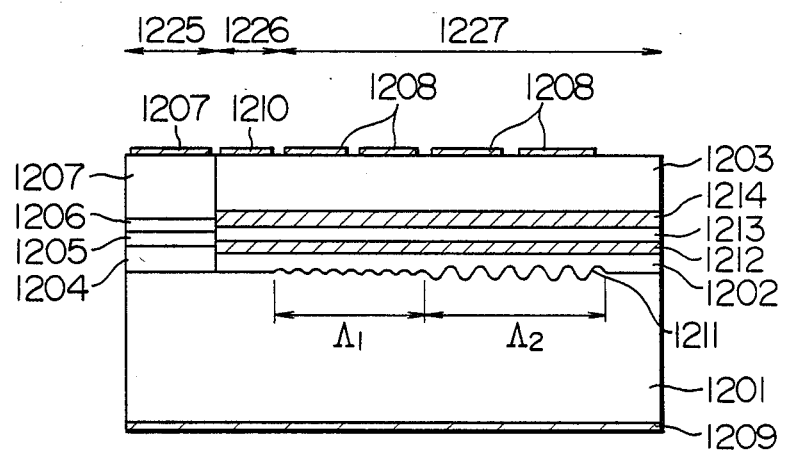
FIG. 12 is a sectional view showing yet still another embodiment of a semiconductor laser device according to the present invention, which embodiment has a structure suited to narrow the width of a spectral line emitted therefrom and indicates that the perturbation portion may be divided into a plurality of sub-perturbation portions and a plurality of electrodes are provided for each sub-perturbation portion, as in the embodiment of FIG. 10.

Referring to FIG. 12, a p-InGaAsP optical guide layer 1204, an undoped InGaAsP active layer 1205, an n-InGaAsP anti-meltback layer 1206 and an n-InP cladding layer 1207 are successively piled on a p-InP substrate 1201 by the epitaxial growth method, and then these layers 1204 to 1207 are selectively etched so that an active region 1225 is left unetched. Thus, the active region 1225 is formed. In a phase adjusting region 1226 and a feedback region 1227, a perturbation portion 1211 made up of a sub-perturbation portion having a perturbation period $\Lambda_1$ equal to 238 nm and a sub-perturbation portion having a perturbation period $\Lambda_2$ equal to 239 nm is formed on an exposed surface area of the p-InP substrate 1201, and then a p-InGaAsP lower cladding layer 1202, an undoped InGaAsP lower optical guide layer 1212, an undoped InGaAsP middle cladding layer 1213, an undoped InGaAsP-InP MQW upper optical guide layer 1214 and an n-InP upper cladding layer 1203 are successively piled on the substrate surface having the perturbation portion 1211 by the epitaxial growth method. Then, separate electrodes 1208 are formed by the evaporation method so that a plurality of separate electrodes correspond to each of the sub-perturbation portions. Negative electrodes 1207 and 1210 in the active region 1225 and the phase adjusting region 1226 and a positive electrode 1209 on the rear surface of the substrate 1201 are formed in the same manner as in the embodiment of FIG. 6. In the present embodiment, the wavelength of generated light can be continuously varied in a range from 1.530 to 1.550 μm (that is, a wavelength range having a width of 20 nm) by adjusting the voltages applied to the separate electrodes 1208 in the feedback region 1227. Further, the width of a spectral line emitted from the present embodiment can be always made less than 10 MHz by adjusting the voltage applied to the negative electrode 1210 of the phase adjusting region 1226.

Figure 13:
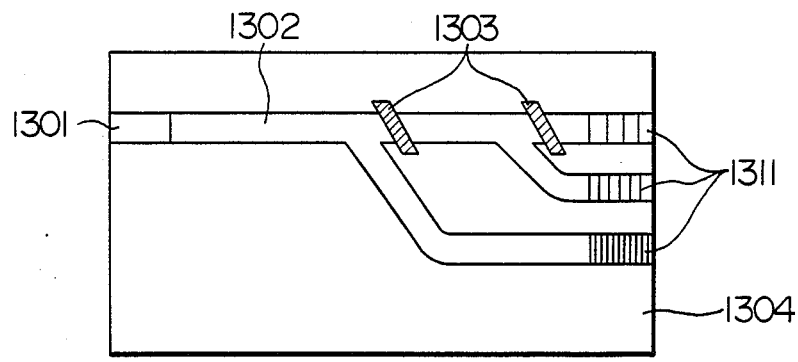
FIG. 13 is a schematic diagram showing yet still a further embodiment of a semiconductor laser device according to the present invention viewed from above the, which embodiment includes optical, functional elements such as an optical branch line and an optical switch.

Next, explanation will be made of yet still a further embodiment of a semiconductor laser device according to the present invention, with reference to FIG. 13. FIG. 13 is a schematic diagram which shows a top view of this embodiment. Referring to FIG. 13, an optical waveguide 1302 is formed on a substrate 1304 so as to branch off at two positions, and an optical switch 1303 is formed at each of the above positions. The refractive index of the optical switch 1303 is varied by injecting carriers therein, and hence the traveling direction of light can be changed at each branch point by the optical switch 1303. A laser 1301 is formed at the left end of the optical waveguide 1302, and diffraction gratings serving as subperturbation portions 1311 are formed in three optical waveguides 1311 which are obtained by the bifurcation at two branch points. The first one of the diffraction gratings has a grating constant of 238 nm, the second diffraction grating has a grating constant of 240 nm, and the third diffraction grating has a grating constant of 242 nm. By operating the laser 1301 and coupling the light from the laser 1301 with one of the diffraction gratings, the wavelength of a laser beam emitted from the present embodiment can be continuously varied in a range from 1.530 to 1.560 μm (that is, a wavelength range having a width of 30 nm).

Next, explanation will be made of an example of an optical communication system which includes a semiconductor laser device according to the present invention, with reference to FIG. 14.

Figure 14:
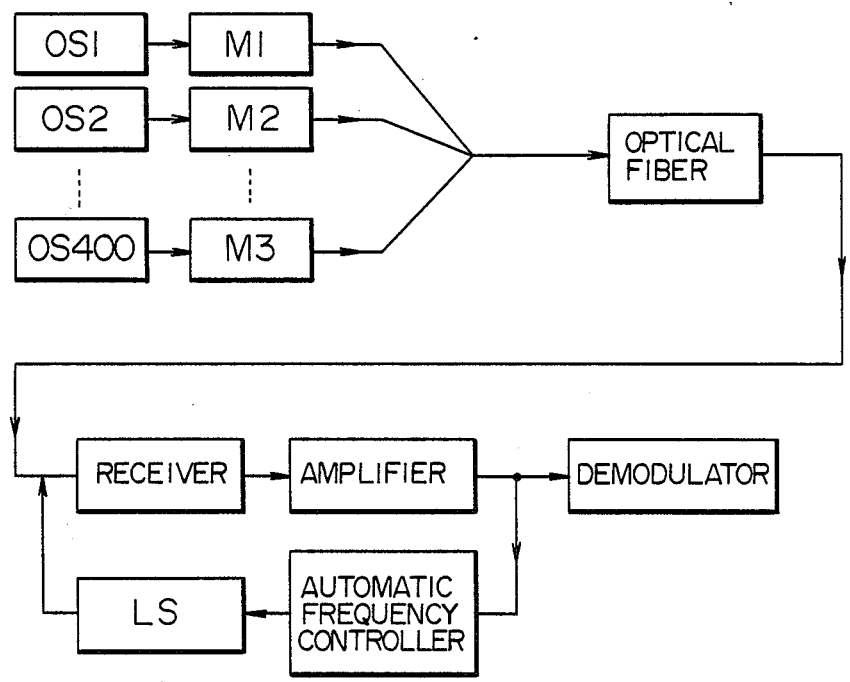
FIG. 14 is a block diagram showing an example of an optical communication system including a semiconductor laser device according to the present invention, and suggesting that the semiconductor laser device can be advantageously used in optical communication systems.

FIG. 14 is a block diagram showing a multi-channel, heterodyne, coherent, optical communication system.

Referring to FIG. 14, light emitted from each of light sources OS1 to OS400 is modulated by a corresponding one of modulators M1 to M400 at a modulation rate of 1 Gb/s. A difference in wavelength between light beams emitted from adjacent light sources is made equal to 0.5 Å. Light from the modulators M1 to M400 is propagated in an optical fiber having a length of 100 Km, and then converted by a receiver into an electric signal. The electric signal from the receiver is amplified by an amplifier and then demodulated by a demodulator, to obtain a desired signal. In order to select the desired signal from 400 signals, heterodyne detection using an optical local oscillator LS and an automatic frequency controller is carried out. It is required that the wavelength of light emitted from the optical local oscillator LS can be changed by more than 20 nm. This communication system has a transmission speed of 400 Gb/s, and makes possible long-distance communication up to 100 Km. A tunable semiconductor laser according to the present invention can be used as the optical local oscillator LS of this system. Further, this system uses 400 light sources OS1 to OS400, and the light sources are selected so that the wavelengths of light beams emitted from the light sources are arranged at intervals of 0.5 Å. A tunable semiconductor laser according to the present invention can satisfy such a wavelength condition, and thus can be used as each of the light sources OS1 to OS400.

Although the invention has been described with reference to a semiconductor laser device which has an active region including an active layer of the planer type, it is to be appreciated that a semiconductor laser device according to the present invention may have other types of active regions including a DH laser type, a BH laser type, and the like. Further, although the invention has been described with reference to a semiconductor laser device made of InP and InGaAsP, it is also to be appreciated that a semiconductor laser device according to the present invention may be made of other compound semiconductor materials such as GaAs, InGaAs, InAlAs, and InAlGaAs.

The invention has been described with reference to the preferred embodiments. Obviously, modifications and alterations can be readily made by those of ordinary skill in the art upon reading and understanding the present specification. It is intended that the invention be construed as including all such alterations and modifications in so far as they come within the scope of the appended claims or the equivalent thereof.

What we claim is:

1. A semiconductor laser device comprising:
a substrate;
an active region formed on the substrate, the active region including an active layer capable of generating light in accordance with carriers injected therein;
a pair of electrodes for injecting the carriers into the active layer;
a feedback region formed on the substrate, the feedback region including an optical guide region and a perturbation portion optically coupled to said optical guide region, the optical guide region guiding the light from the active layer, the perturbation portion having non-uniform perturbation distribution; and
means for changing the degree of coupling of the light in the feedback region and a part of the perturbation region.

2. A semiconductor laser device as set forth in claim 1, wherein the optical guide region in the feedback region has a plurality of optical guide layers.

3. A semiconductor laser device as set forth in claim 1, wherein the perturbation portion in the feedback region has a plurality of sub-perturbation portions, and each of the sub-perturbation portions has its own perturbation period.

4. A semiconductor laser device as set forth in claim 1, wherein the means for changing the degree of coupling is a plurality of electrodes formed on the feedback region.

5. A semiconductor laser device as set forth in claim 4, wherein the perturbation portion in the feedback region has a plurarity of sub-perturbation portions, each of the sub-perturbation portions has its own perturbation period, and at least two electrodes corresponding to each sub-perturbation portion are provided.

6. A semiconductor laser device including an active layer for generating light in accordance with carriers injected therein and a pair of electrode for injecting the carriers, comprising:
a plurality of semiconductor layers formed on the substrate, the semiconductor layers including a perturbation portion with non-uniform perturbation period,
an optical guide region for guiding light, the optical guide region being optically coupled with the perturbation portion; and
means for changing light intensity distribution in the semiconductor layers to vary the wavelength of generated light.

7. A semiconductor laser device as set forth in claim 6, wherein the means for changing the light intensity distribution is a plurality of electrodes formed on the semiconductor layers.

8. A semiconductor laser device as set forth in claim 6, wherein the perturbation portion has a plurality of sub-perturbation portions, each of the sub-perturbation portions has its own perturbation period.

9. A semiconductor laser device comprising:
an active region for generating light;
a pair of electrodes for injecting carriers into the active region so that the light is generated in the active region; and
a feedback region optically coupled with the active region, the feedback region having a plurality of structural parameters being combined with each other so as to change the wave length of light in accordance with light distribution change in the feedback region.

10. A semiconductor laser device as set forth in claim 9, wherein one of the structural parameters is a perturbation portion which has non-uniform perturbation period.

11. A semiconductor laser device as set forth in claim 10, wherein another one of the structural parameters is a plurality of electrodes formed on the feedback region.

12. A semiconductor laser device as set forth in claim 11, wherein the electrodes are used for forming an electric field in the feedback region so that the light intensity distribution in the feedback region is changed.

13. A semiconductor laser device as set forth in claim 11, wherein the electrodes supply carriers in the feedback region so that the light intensity distribution in the feedback region is changed.

14. A semiconductor laser device as set forth in claim 9, wherein the perturbation portion includes a plurality of sub-perturbation portions, each of the subperturbation portions has its own perturbation period.

15. A semiconductor laser device as set forth in claim 9, wherein the device also has means for changing the degree of coupling of the light propagated in the feedback region with a desired part of the perturbation portion.

16. A semiconductor laser device as set forth in claim 15, wherein the means for changing the degree of coupling is a plurality of electrodes formed on the feedback region.

17. A semiconductor laser device as set forth in claim 9, wherein the active region and the feedback region are optically coupled with each other through a phase adjusting region.

18. A semiconductor laser device as set forth in claim 17, wherein the phase adjusting region has an optical path whose optical path length is varied so as to match phases of light in the active region and the feedback region.

19. A semiconductor laser device as set forth in claim 9, wherein the feedback region has an optical guide region for guiding the light generated in the active region.

20. A semiconductor laser device as set forth in claim 19, wherein the distance between the optical guide region and the perturbation portion is not larger than 0.5 μm.

21. A semiconductor laser device as set forth in claim 19, wherein the optical guide region has a plurarity of optical guide layers.

22. A semiconductor laser device as set forth in claim 21, wherein at least one of the optical guide layers has a milti-quantum well structure.

* * * * *

UNITED STATES PATENT AND TRADEMARK OFFICE
CERTIFICATE OF CORRECTION

PATENT NO. : 4,885,753                    Page 1 of 2
DATED      : December 5, 1989
INVENTOR(S): M. OKAI, et al.

It is certified that error appears in the above-identified patent and that said Letters Patent is hereby corrected as shown below:

Column 2, line 59, change "a" between "to" and "aspect" to --an--.

Column 2, line 60, after "invention" insert a comma.

Column 4, lines 52 and 53, insert a comma after "above" in line 52, and in line 53, delete "the,".

Column 5, line 41, delete the second "a" at the end of the line.

Column 7, line 56, delete the word "made".

Column 9, line 9, change "InGaAsPInP" to --InGaAsP-InP--.

Column 13, line 59, change "plurarity" to --plurality--.

Column 13, line 65, change "electrode" to --electrodes--.

UNITED STATES PATENT AND TRADEMARK OFFICE
CERTIFICATE OF CORRECTION

PATENT NO. : 4,885,753
DATED : December 5, 1989
INVENTOR(S) : M. Okai, et al.

It is certified that error appears in the above-identified patent and that said Letters Patent is hereby corrected as shown below:

Column 14, line 15, between "portions," and "each" insert --and--.

Column 14, line 45, between "portions," and "each" insert --and--.

Column 16, line 1, change "plurarity" to --plurality--.

Column 16, line 5, change "milti-quantum" to --multi-quantum--.

Signed and Sealed this

Twenty-ninth Day of January, 1991

Attest:

HARRY F. MANBECK, JR.

*Attesting Officer*      *Commissioner of Patents and Trademarks*